(12) United States Patent
Wong et al.

(10) Patent No.: US 6,267,142 B1
(45) Date of Patent: Jul. 31, 2001

(54) FLUID DELIVERY STABLIZATION FOR WAFER PREPARATION SYSTEMS

(75) Inventors: Larry Ping-Kwan Wong, Fremont; John Martin deLarios, Palo Alto, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/344,674

(22) Filed: Jun. 25, 1999

(51) Int. Cl.[7] .................................................. B08B 3/00
(52) U.S. Cl. .................. 137/605; 137/896; 134/94.1; 134/95.1
(58) Field of Search .................. 137/605, 602, 137/896; 222/145.1, 145.5, 145.6; 134/902, 94.1, 95.1

(56) References Cited

U.S. PATENT DOCUMENTS

| 5,129,955 | 7/1992 | Tanaka . |
| 5,745,946 | * 5/1998 | Thrasher et al. . |
| 5,899,216 | * 5/1999 | Goudine et al. . |
| 6,070,600 | * 6/2000 | Grootegoed et al. ............... 134/111 |

FOREIGN PATENT DOCUMENTS

| 63-4617 | 1/1988 | (EP) . |
| 95 08510 | 7/1995 | (FR) . |
| 10-326764 | * 3/1999 | (JP) . |
| 11-087285 | * 6/1999 | (JP) . |
| WO 97/13590 | 4/1997 | (WO) . |

* cited by examiner

*Primary Examiner*—Kevin Lee
(74) *Attorney, Agent, or Firm*—Martine & Penilla, LLP

(57) ABSTRACT

A solution delivery system for use with a wafer preparation system is provided. The solution deliver system includes a de-ionized water (DIW) dispense drawer having an input for receiving an initial flow of DIW from a facility water supply. The DIW dispense drawer further includes a first pressure regulator for stabilizing the initial flow of DIW and producing a substantially steady flow of DIW as a DIW output of the DIW dispense drawer. A chemical drawer is also provided as part of the solution delivery system. The chemical drawer is configured to receive the substantially steady flow of DIW from the DIW dispense drawer. The chemical drawer is further configured to receive an initial flow of chemicals from a chemical source. The chemical drawer also includes a second pressure regulator for stabilizing the initial flow of chemicals from the chemical source and thus producing a substantially steady flow of chemicals. In this example, the chemical drawer further includes a mix manifold for mixing the substantially steady flow of DIW received from the DIW dispense drawer and the substantially steady flow of chemicals. The mix manifold being configured to output a chemical solution having a controlled concentration.

20 Claims, 7 Drawing Sheets

FLUID DELIVERY STABLIZATION FOR WAFER PREPARATION SYSTEMS

BACKGROUND OF THE INVENTION

1. Field of the Invention

This invention relates generally to fluid pressure regulating systems, and more particularly to systems for stabilizing the delivery flow of water and chemicals to a wafer preparation station.

2. Description of the Related Art

As is well known, semiconductor devices are fabricated from semiconductor wafers, which are subjected to numerous processing operations. These operations include, for example, impurity implants, gate oxide generation, intermetal oxide depositions, metallization depositions, photolithography pattering, etching operations, chemical mechanical polishing (CMP), etc. Although these processes are performed in ultra clean environments, the very nature of many of the process operations is to blame for the generation of surface particles and residues. For instance, when CMP operations are performed, a film of particles and/or metal contaminants are commonly left behind.

Because surface particles can detrimentally impact the performance of an integrated circuit device, wafer cleaning operations have become a standard procedural requirement after certain process steps. Although cleaning operations are rather procedural, the equipment and chemicals implemented to perform the actual cleaning are highly specialized. This specialization is important because each wafer, being at different stages of fabrication, represents a significant investment in terms of raw materials, equipment fabrication time, and associated research and development.

To perform the cleaning operations in an automated manner, fabrication labs typically employ a cleaning system. A typical cleaning system may be, for example, a Synergy™ cleaning system from OnTrak™ of Lam Research Corporation, Fremont, Calif. A typical Synergy™ cleaning system employs two brush stations, where each brush station has a set of brushes for cleaning the top and bottom surfaces of a wafer. Each of the brushes are commonly configured to deliver chemicals and DI water Through-The-Brush (TTB) or by way of a drip dispensing bar, to enhance the cleaning ability of the system. The system typically also includes a spin-rinse station, where a wafer, after being cleaned in the brush stations is rinsed with DI water and dried before completing the cleaning cycle.

As can be appreciated, it is very important that facility lines, which supply the DI water to the cleaning system supply the water at substantially steady water pressure levels. Unfortunately, the facility lines in different fabrication labs vary substantially. Thus, the delivered water can have fluctuating pressures that cause more or less water to be supplied during a wafer preparation operation. On the same token, it is very important for facility lines, which supply chemicals to a system deliver a steady flow to internal modules that mix DI water with the delivered chemicals.

For instance, in cases where the chemical solution is hydrofluoric (HF) acid, if too much HF acid may be mixed with DI water, the resulting solution can be too strong and therefore cause over etching to occur. In other cases, not enough DI water is mixed with HF acid, which can also produce an over concentrated solution. The possibility of over etching, under etching, or just simply inappropriate wafer surface preparation can cause dies of a prepared wafer to be unreliable or damaged.

In view of the foregoing, there is a need for systems and methods for stabilizing DI water and chemical delivery to wafer preparing systems.

SUMMARY OF THE INVENTION

Broadly speaking, the present invention fills these needs by providing systems and methods for stabilizing DI water delivery and chemical delivery to wafer preparation systems. By stabilizing the DI water and chemical delivery, more precision chemical solutions can be produced, thus improving wafer preparation operations, such as, cleaning operations, and combined cleaning and etching operations. It should be appreciated that the present invention can be implemented in numerous ways, including as a process, an apparatus, a system, a device, or a method. Several inventive embodiments of the present invention are described below.

In one embodiment, a solution delivery system for use with a wafer preparation system is disclosed. The solution delivery system includes a de-ionized water (DIW) dispense drawer having an input for receiving an initial flow of DIW from a facility water supply. The DIW dispense drawer further includes a first pressure regulator for stabilizing the initial flow of DIW and producing a substantially steady flow of DIW as a DIW output of the DIW dispense drawer. A chemical drawer is also provided as part of the solution delivery system. The chemical drawer is configured to receive the substantially steady flow of DIW from the DIW dispense drawer. The chemical drawer is further configured to receive an initial flow of chemicals from a chemical source. The chemical drawer also includes a second pressure regulator for stabilizing the initial flow of chemicals from the chemical source and thus producing a substantially steady flow of chemicals. In this preferred embodiment, the chemical drawer further includes a mix manifold for mixing the substantially steady flow of DIW received from the DIW dispense drawer and the substantially steady flow of chemicals. The mix manifold being configured to output a chemical solution having a controlled concentration.

In another embodiment, a fluid delivery system for controllably channeling fluids to at least one wafer preparation station is disclosed. The fluid delivery system includes a de-ionized water (DIW) dispense drawer having an input for receiving an initial flow of DIW from a facility water supply. The DIW dispense drawer includes a first pressure regulator for stabilizing the initial flow of DIW and therefore produce a first substantially steady flow of DIW as a first DIW output of the DIW dispense drawer. The DIW dispense drawer also includes a second pressure regulator for stabilizing the initial flow of DIW and to produce a second substantially steady flow of DIW as a second DIW output of the DIW dispense drawer. The DIW dispense drawer can then be coupled to one or more chemical drawers to perfect the delivery of a chemical solution to a wafer preparation system, such as brush box.

In yet a further embodiment, a chemical delivery system for channeling fluids received from a water source and a chemical source to a chemical wafer preparation station is disclosed. The chemical deliver system includes a chemical module being configured to receive a flow of DIW from the water source. The chemical module is configured to receive an initial flow of chemicals from the chemical source. The chemical module further includes a pressure regulator for stabilizing the initial flow of chemicals from the chemical source and producing a substantially steady flow of chemicals. The stabilizing is configured by adjusting a pressure of the initial flow of chemicals to a reduced pressure.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for systems and methods for stabilizing DI water delivery and chemical delivery to wafer preparation systems. It will be obvious, however, to one skilled in the art, that the present invention may be practiced without some or all of these specific details. In other instances, well known process operations have not been described in detail in order not to unnecessarily obscure the present invention.

Figure 1A:
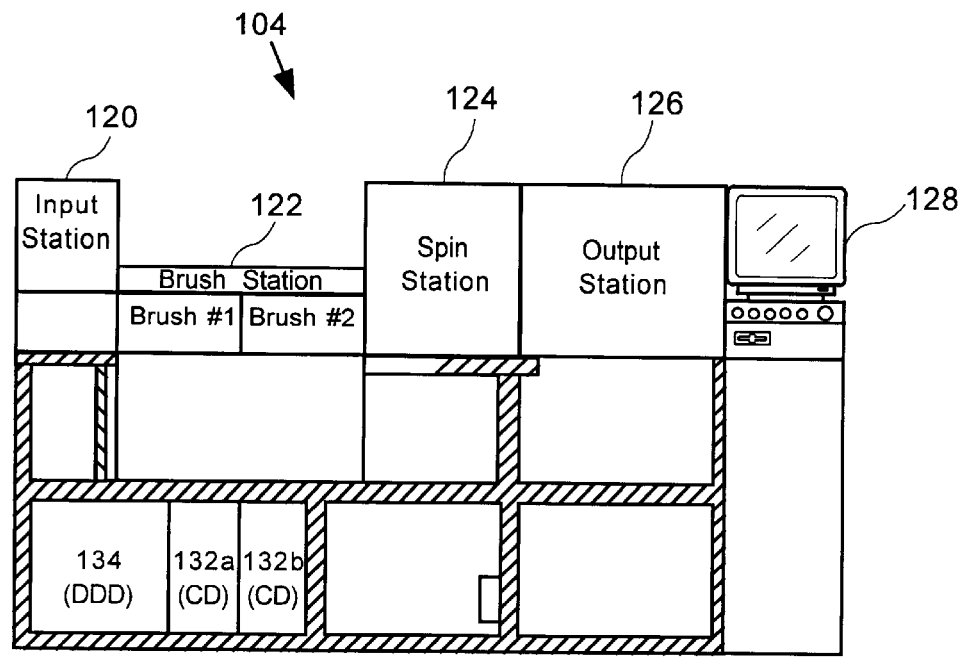
FIGS. 1A and 1B show a side view and a top view, respectively, of a wafer cleaning system.
Figure 1B:
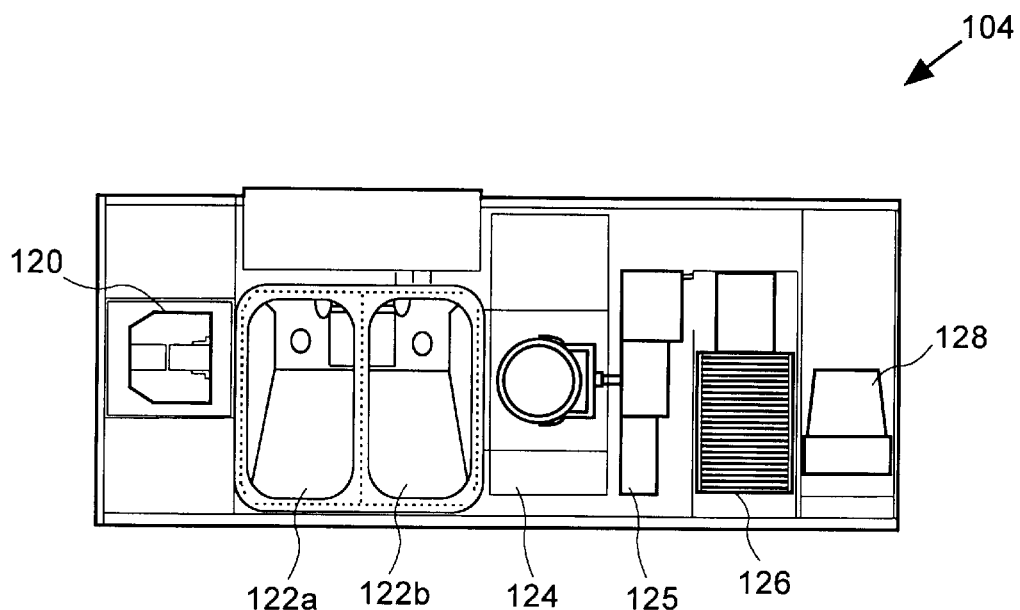

FIGS. 1A and 1B show a side view and a top view, respectively, of a cleaning system 104. The cleaning system 104 typically includes an input station 120 where a plurality of wafers may be inserted for cleaning through the system. Once the wafers are inserted into the input station 120, a wafer may be taken from the input station 120 and moved into a first brush station 122a, where the wafer is scrubbed with selected chemicals and water (e.g., DI water), before being moved to a second brush station 122b of a double contained dual brush box 122.

After a wafer has been scrubbed in the double contained dual brush box 122, the wafer is moved into a spin station 124 where de-ionized water is sprayed onto the surface of the wafer and spun to dry. After the wafer has been rinsed in spin station 124, an unload handler 125 takes the wafer and moves it into an output station 126. The cleaning system 104 is configured to be programmed and controlled from system electronics 128. The cleaning system 104 also shows a de-ionized water dispense drawer (DDD) 134 and two chemical drawers 132a and 132b. In a preferred embodiment, the DDD 134 and the chemical drawers 132 are configured to be placed in an underneath section of the cleaning station 104 and, when the doors are open, the drawers are configured to slide out to enable servicing. As will be described in greater detail below, the facility wafer supply is communicated to the cleaning system 104 through the DDD 134, and chemicals are introduced by way of the chemical drawers 132.

Figure 2A:
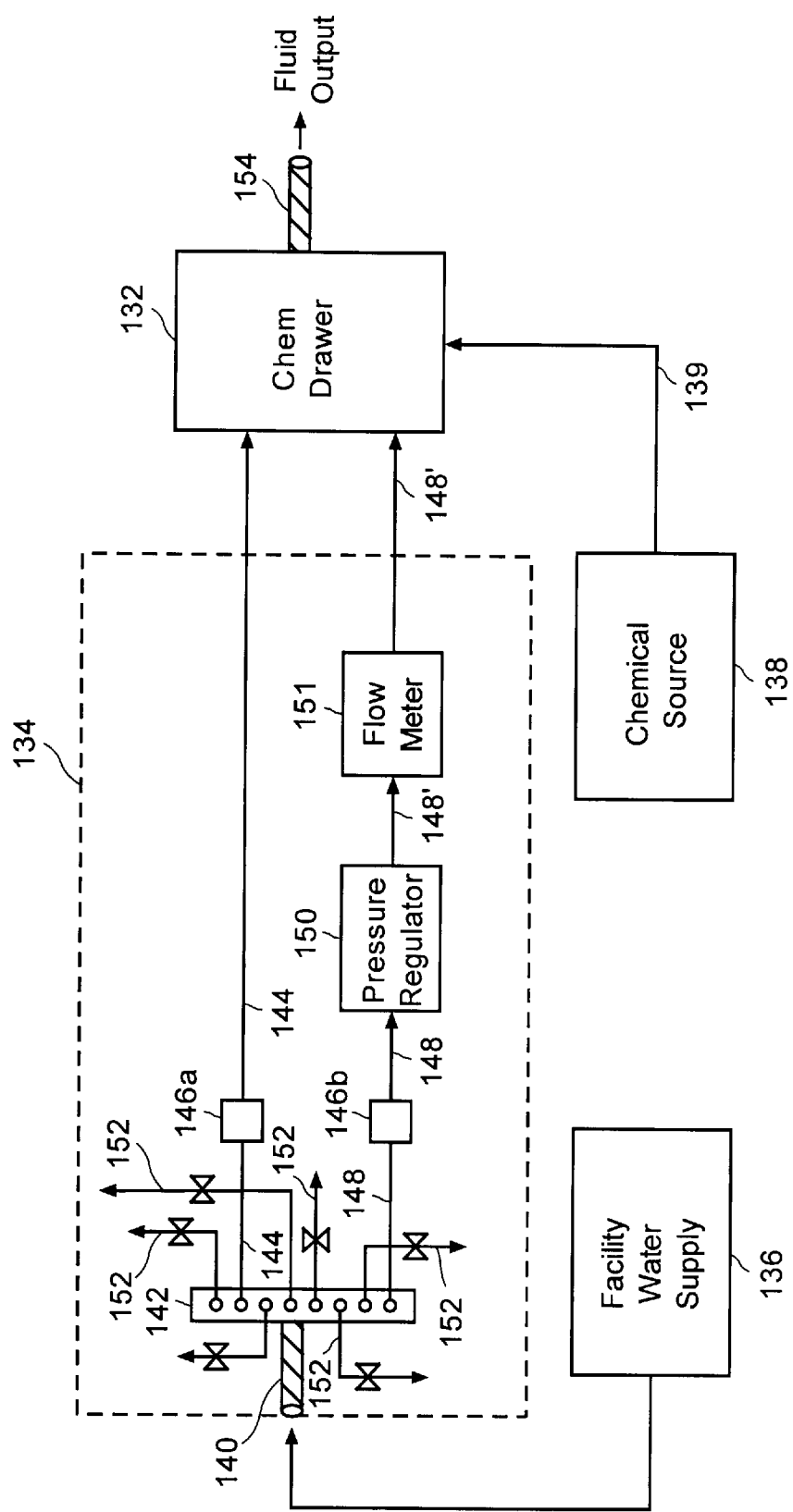
FIG. 2A shows a more detailed block diagram of a de-ionized water dispense drawer in communication with a chemical drawer, in accordance with one embodiment of the present invention.

FIG. 2A shows a more detailed block diagram of the de-ionized water dispense drawer 134 in communication with the chemical drawer 132, in accordance with one embodiment of the present invention. As shown, the de-ionized water dispense drawer 134 is configured to receive de-ionized water from a facility water supply 136 via an input 140. The input 140 leads to a manifold 142. The manifold 142 is configured to supply de-ionized water to several lines which are channeled throughout the cleaning station. By way of example, some of the lines may be used by input sprays, spin station wafer rinsing, sprays in the input station, and the like.

Accordingly, the water pressure delivered by the manifold 142 will vary during a cleaning process in view of the demands placed on the manifold 142 at different times. This water pressure variation, as mentioned above, is very undesirable and can lead to inappropriate wafer surface preparation. In this embodiment, the chemical drawer 132 is configured to receive two lines from the de-ionized water dispense drawer 134. The first de-ionized water line is line 144, which has a pneumatic valve 146a for controlling the turning-on and off of the line at different times during a cleaning process.

By way of example, the line 144 is typically used for high flow cleaning of the brushes, brush boxes, or other parts of the system. The high flow de-ionized water therefore does not need to be carefully regulated when it is passed through the chemical drawer 132 and out line 154 to the fluid output. As such, line 144 alone is generally used when the brush boxes are flushed to remove chemicals previously used during a cleaning operation or other operations that may have left residues or chemicals behind. On the other hand, when chemical cleaning is being performed in one of the brush boxes, the chemical solution that is produced by the chemical drawer 132 will depend upon the precision delivery of de-ionized water (DIW) from the de-ionized water dispense drawer 134. Accordingly, line 148 (e.g., a lower-flow line) will be passed through a pneumatic valve 146b and to a pressure regulator 150. The pressure regulator 150 is configured to at least partially attenuate the water pressure level received from the facility water supply 136 to a point where any water pressure fluctuations are substantially eliminated. By way of example pressure regulator 150 can be a Teflon Dome Loaded Regulator, model 973, which is available from MACE, of Upland, California.

The substantially stabilized water pressure exiting the pressure regulator 150 then travels through line 148' to a flow meter 151. The flow meter 151 can therefore control the flow of water being received from the pressure regulator 150 and then output to the chemical drawer 132 through line 148'. By way of example flow meter 151 can be a Futurestar flow meter, model number 154-00250, which is available from Futurestar Corp., of Bloomington, Minn.

As can be appreciated, line 144 is generally used during non-critical cleaning operations, such as chemical flushing operations and the like. Line 148, which is passed through a pressure regulator 150 is used to produce a steady flow of de-ionized water through line 148' to the chemical drawer 132 when precision delivery of de-ionized water is needed by the chemical drawer to ensure that the proper concentration levels are mixed within the chemical drawer and provided to line 154. As shown, the chemical drawer will also receive chemicals from a chemical source 138 via a line 139.

Figure 2B:
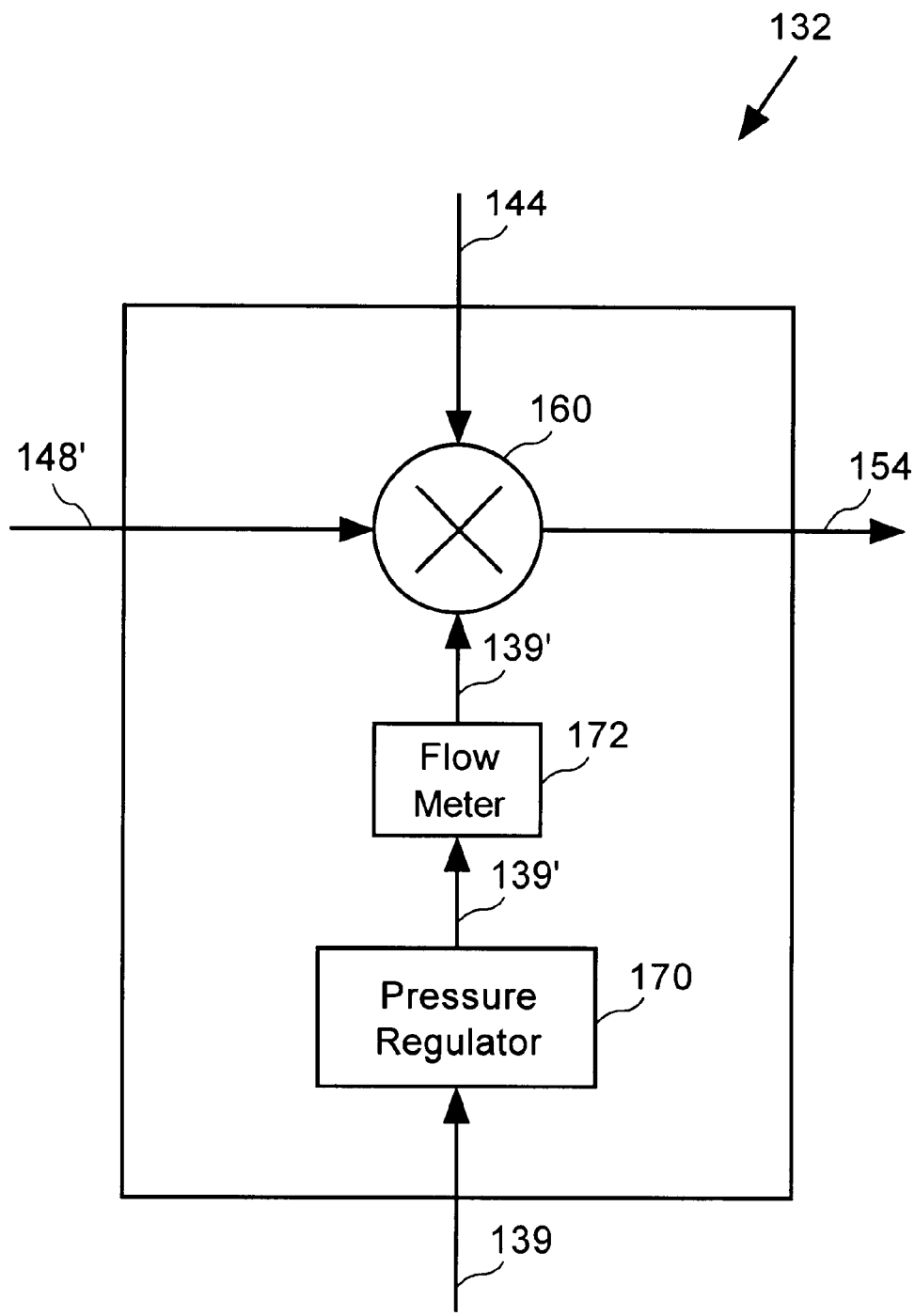
FIG. 2B illustrates a more detailed diagram of the chemical drawer, in accordance with one embodiment of the present invention.

FIG. 2B illustrates a more detailed diagram of the chemical drawer 132, in accordance with one embodiment of the present invention. The chemical drawer 132 includes a pressure regulator 170, a flow meter 172, and a mixing manifold 160. The mixing manifold 160 is configured to receive line 144 as well as line 148'. Line 139 will deliver the chemicals to a pressure regulator 170, which will assist in stabilizing fluctuations that may be received from the chemical source 138 and provide a more steady and controlled flow of chemicals through line 139' to the flow meter 172. The pressure regulator 170 can be, in one embodiment, the same as pressure regulator 150. Also, flow meter 172 may be the same as flow meter 151.

The flow meter 172 with the adjustable valve can then be used to adjust the flow of the steady chemicals received from the pressure regulator 170 and output through line 139' to the mix manifold 160. In one embodiment, when controlled mixing of deionized water and a specific chemical is desired in the chemical drawer 132, only the steady flow of de-ionized water from line 148' and the steady flow from line 139' will be introduced in the mixing manifold 160. The mixing manifold 160 will therefore be able to produce a well controlled mixture of chemicals and de-ionized water before being output as a chemical solution onto line 154. Line 154 will then feed to the chemical cleaning brushes or drip systems contained within the brush boxes of the cleaning station 104.

It is important to note that by ensuring that the de-ionized water flow is steady and controlled through line 148' and that the delivery of chemicals through line 139' is also steady and controlled, and the mix manifold 160 will ensure that the appropriate amounts of de-ionized water and chemicals are mixed to produce the precise solution for optimally preparing the surface of the wafer. In one embodiment, the surface of the wafer can be prepared such that the preparation cleans the surface of the wafer. In other embodiments, the preparation of the wafer surface is such that a controlled etching operation and cleaning operation are performed simultaneously in the cleaning station. When the etching and cleaning are performed, chemicals such as, hydrofluoric (HF) acid are introduced by the chemical source 138 to the chemical drawer 132.

As should be appreciated by those skilled in the art, if the precise amount of chemical solution (such as HF) is not provided to the mix manifold 160, in some situations, too much or too little chemical will be prepared as part of the solution that is output through the line 154. When this is the case, there may be situations in which too much material is etched away or too little material is etched away, thereby causing irreversible damage to the wafer surface being prepared.

Figure 3A:
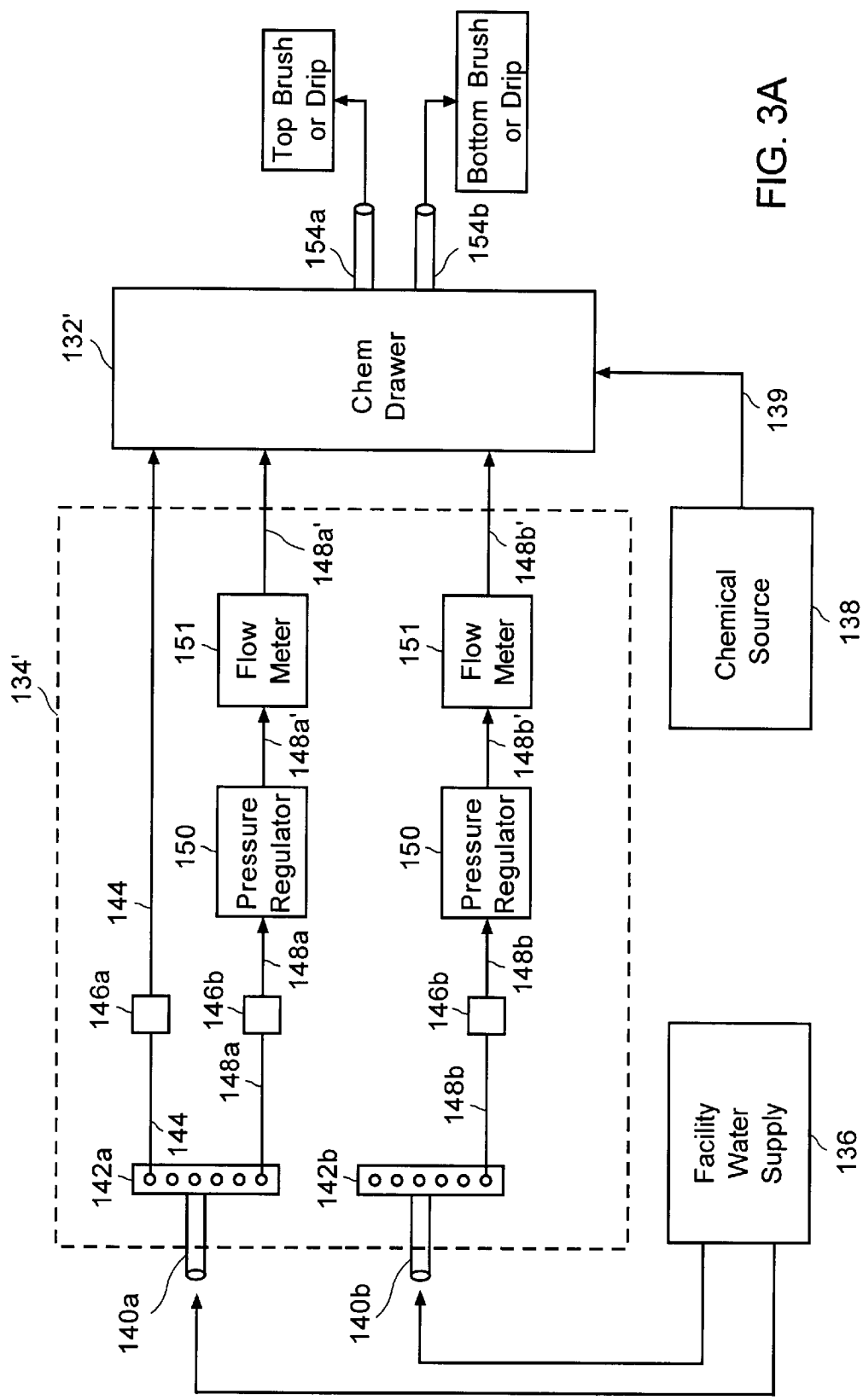
FIG. 3A illustrates a detailed diagram of another de-ionized water dispense drawer in which components are provided for communicating fluids to a chemical drawer, in accordance with one embodiment of the present invention.

FIG. 3A illustrates a detailed diagram of a de-ionized water dispense drawer 134' in which components are provided for communicating fluids to a chemical drawer 132', in accordance with one embodiment of the present invention. Preferably, the chemical drawer 132' channels surface preparation fluids to a top brush and a bottom brush, and/or a drip delivery bar within a brush box. As shown, the de-ionized water dispense drawer 134' includes two manifolds 142a and 142b for receiving de-ionized water from the facility water supply 136 through lines 140a and 140b, respectively. The first manifold 142a can be set up to provide a high flow of de-ionized water through line 144 to the chemical drawer 132' during non-critical water supply operations.

However, when critical wafer surface preparation operations are performed which require precision mixing of selected amounts of de-ionized water and chemicals, the line 148a coming from manifold 142a is provided to a pressure regulator 150. The pressure regulator 150, as described above, is configured to stabilize and remove the pressure fluctuations introduced to line 148a, and thereby produced substantially controlled, non-fluctuating flows of de-ionized water through line 148a' that is provided to the flow meter 151. The flow meter 151 can then control the flow of the controlled water out to line 148a' that is communicated to the chemical drawer 132'.

In general, the line 148a' is delivered to the chemical drawer 132' in such a way that the de-ionized water is mixed with chemicals that are configured to be delivered to a top brush of a brush box cleaning system. As shown herein, line 154a will provide the properly mixed chemical solution to the top brush or alternatively, to a drip bar. The manifold 142b is configured to provide fluids through line 148b, through a pneumatic valve 146b, and then to a pressure regulator 150. The pressure regulator 150, as was described above, is configured to stabilize fluctuations in the water pressure provided in line 148b and controllably reduce fluctuations in the water that is provided to line 148b'. In one example, the DI water pressure coming from a facility line may have a pressure of about 25 PSI, and the pressure can be regulated down to about 15 PSI, while effectively stabilizing any pressure fluctuations present in the facility line. Line 148b' is then passed through a flow meter 151 that adjusts the amount of water passed through line 148b' to the chemical drawer 132'.

The chemical drawer 132' will have a mixing manifold for mixing chemicals with the de-ionized water provided by line 148b'. The properly prepared solution can then be provided to line 154b. Line 154b is preferably configured to deliver the properly mixed solution to a bottom brush of a brush box cleaning system. Alternatively, line 154b can also be provided to a drip bar within the brush box system.

Figure 3B:
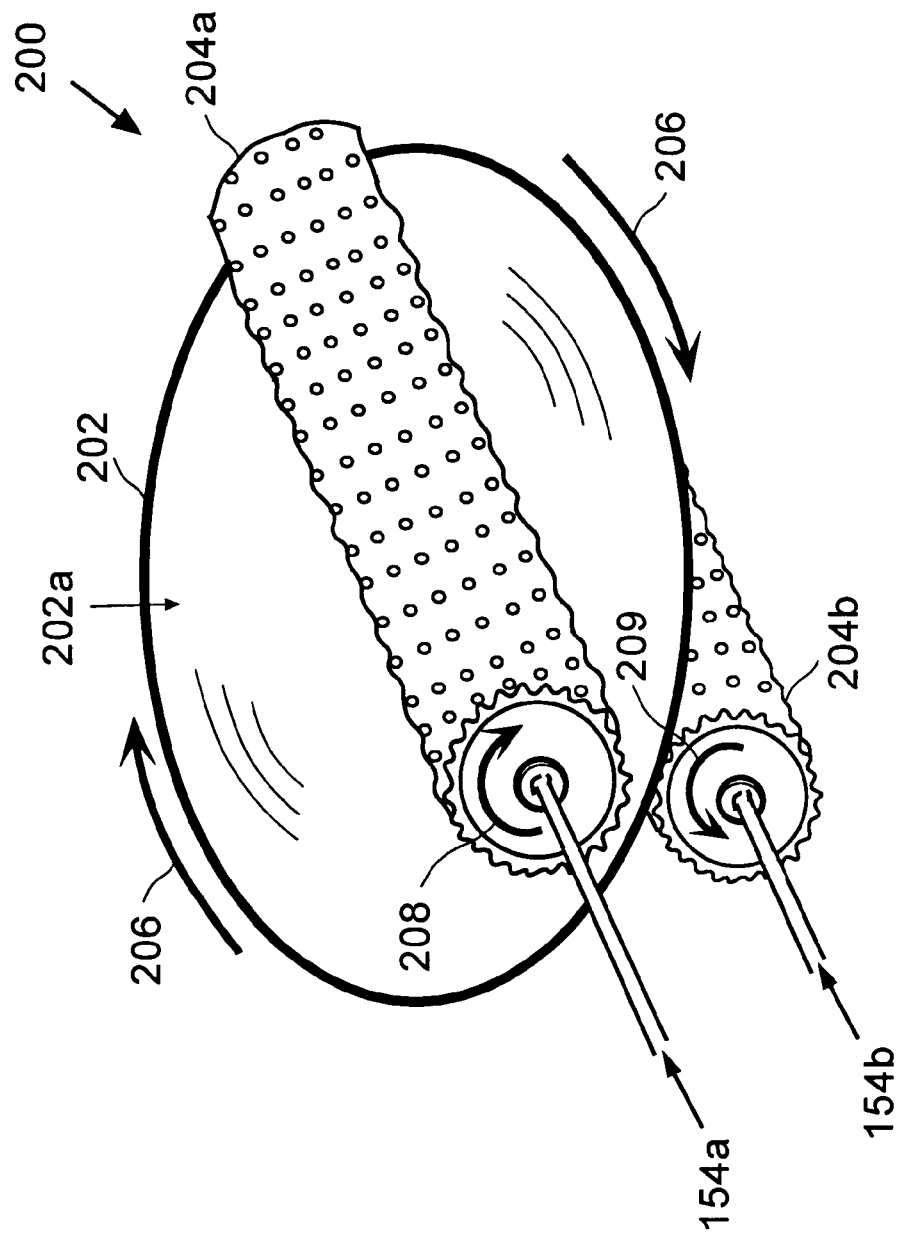
FIG. 3B illustrates a simplified diagram of a pair of brushes which may be implemented in one of the brush boxes of FIGS. 1A and 1B.

FIG. 3B illustrates a simplified diagram 200 of a pair of brushes 204 which may be implemented in one of the brush boxes 122a or 122b of FIGS. 1A and 1B. In this example, a wafer 202 is shown in the process of being scrubbed by the top brush 204a and the bottom brush 204b to prepare the surface 202a of the wafer 202. In general, the wafer is configured to rotate in a direction 206, while top brush 204a rotates in a direction 208, and the bottom brush 204b rotates in a direction 209a. As described with reference to FIG. 3A, the line 154a that is output from the chemical drawer 132' is provided to the top brush 204a. In a like manner, the line 154b is provided to the bottom brush 204b. The chemical solution delivery shown here is a through the brush (TTB) chemical application technique. Of course, other chemical application techniques such as, for example, drip application can also be used.

If a cleaning system has two brush boxes, another pair of brushes 204 will be provided in the second brush box. Additionally, a second chemical drawer will be provided in the cleaning system as illustrated in FIG. 1A (i.e., a first chemical drawer 132a and a second chemical drawer 132b). Each of these chemical drawers will therefore provide chemicals to each of the brush boxes having respective pairs of brushes for cleaning wafers.

Figure 3C:
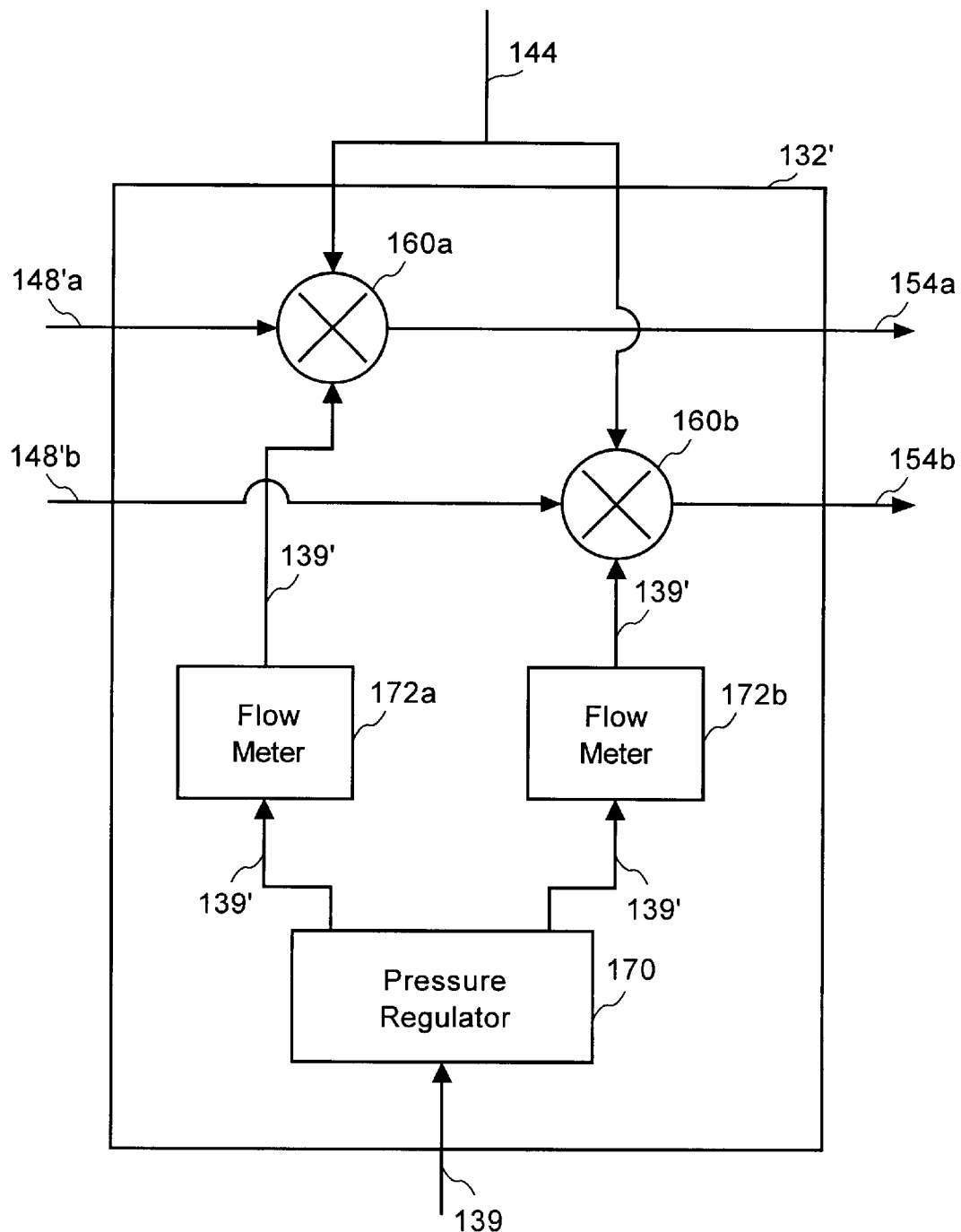
FIG. 3C illustrates a more detailed diagram of the chemical drawer of FIG. 3A, in accordance with one embodiment of the present invention.

FIG. 3C illustrates a more detailed diagram of the chemical drawer 132' of FIG. 3A, in accordance with one embodiment of the present invention. The chemical drawer 132' is configured to receive chemicals through the chemical line 139 that is passed through a pressure regulator 170. The pressure regulator 170 is configured to stabilize pressure fluctuations that may be present in the fluids being received from the chemical line 139. The pressure regulator 170 will therefore provide a constant controlled flow of chemicals through lines 139' to flow meters 172a and 172b.

The flow meters 172a and 172b can be controlled to appropriately deliver the correct amount of flow to a mix manifold 160a and a mix manifold 160b, respectively. In this example, the flow meter 172a is configured to deliver a controlled amount of chemicals through line 139' to the mix manifold 160a. The mix manifold 160a will therefore receive the appropriate amount of de-ionized water from line 148a' and thus be provided to line 154a, which can be delivered to a top brush, as shown in FIG. 3B. The flow meter 172b can be configured to deliver the appropriate controlled amount of chemicals through line 139' and then to mix manifold 160b. Mix manifold 160b will receive the controlled amount of de-ionized water from line 148b' and thus deliver it to line 154b that is communicated to the bottom brush 204b of FIG. 3B.

Figure 4:
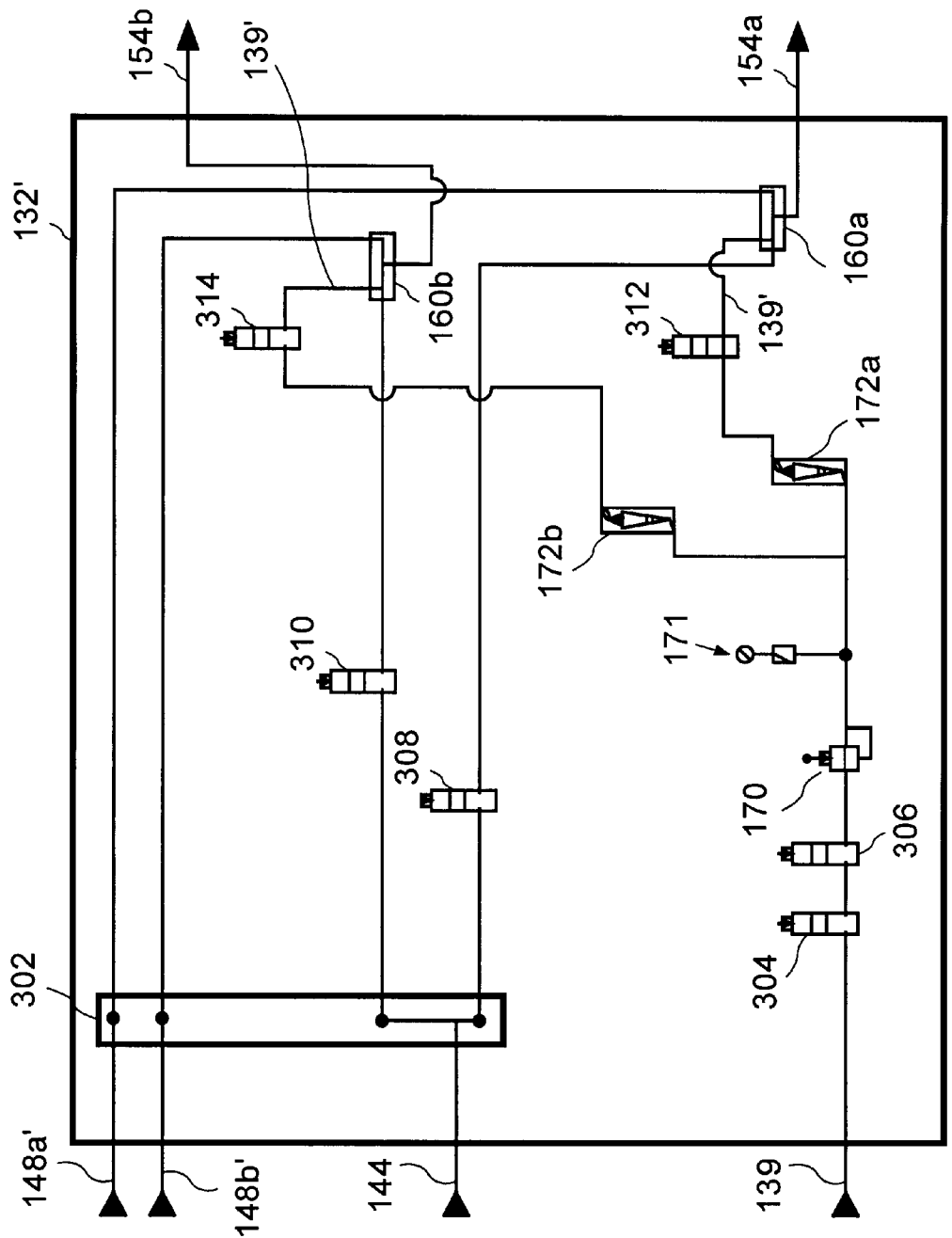
FIG. 4 illustrates another detailed diagram of the chemical drawer, in accordance with one embodiment of the present invention.

FIG. 4 illustrates a more detailed diagram of the chemical drawer 132', in accordance with one embodiment of the present invention. As shown, lines 148a' and 148b' are provided to a manifold 302 which communicates line 148a' to mix manifold 160a, and line 148b' to mix manifold 160b. Line 144 is communicated to the manifold 302, which is then communicated to a pneumatic valve 308, and a pneumatic valve 310. Pneumatic valves 308 and 310 are separately controlled by pneumatic lines (not shown), during different stages of a cleaning operation. The fluids flowing through line 144 can then be communicated through pneumatic valve 310 to the mix manifold 160b, and pneumatic valve 308 can allow communication of water from line 144 to the mix manifold 160a when appropriate.

Line 139 is provided from the chemical source 138 and couples to a pneumatic valve 304. Pneumatic valve 304 and pneumatic valves 312 and 314 are also similarly controlled by the same pneumatic control line. The chemicals 139 once passed through pneumatic valve 306 will be communicated through a pressure regulator 170 that stabilizes pressure fluctuations in the chemical line and thus reduces the pressure to a suitable pressure that will be provided to flow meters 172a and 172b. A pressure gauge 171 is provided after the pressure regulator 170 to enable monitoring of the pressure and its behavior once it is output from the pressure regulator 170. That is, the pressure meter 171 will enable monitoring of whether the pressure regulator 170, once adjusted, has appropriately stabilized any fluctuations in pressure that may have been provided through line 139.

As mentioned above, the chemicals are then passed through flow meters 172a and 172b and communicated to pneumatic valves 312 and 314. When pneumatic valves 312 and 314 are appropriately set to allow communication of the chemicals, the chemicals will be provided through lines 139' to the mix manifolds 160a and 160b, which will then communicate the appropriately mixed solution through line 154a and 154b. The mixed solution, will be the product of a carefully and precisely mixed amount of de-ionized water provided through lines 148a' and 148b', and chemicals provided through line 139'. Lines 154a, and 154b, will therefore output the correctly mixed chemical solution to the pair of brushes in a brush box system, and the surface of the wafer will be appropriately prepared.

For more information on wafer preparing systems and techniques, reference may be made to commonly owned U.S. patent application Ser. Nos. 08/792,093, filed Jan. 31, 1997, entitled "Method And Apparatus For Cleaning Of Semiconductor Substrates Using Standard Clean 1 (SC1)," Ser. No. 08/542,531, filed Oct. 13, 1995, entitled "Method and Apparatus for Chemical Delivery Through the Brush," and Ser. No. 09/277,712, filed Mar. 26, 1999, entitled "Pressure Fluctuation Dampening System." All three U.S. patent applications are hereby incorporated by reference.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A solution delivery system for use with a wafer preparation system, comprising:

a de-ionized water (DIW) dispense drawer having an input for receiving an initial flow of DIW from a facility water supply, a first pressure regulator for stabilizing the initial flow of DIW and producing a substantially steady flow of DIW as a first DIW output of the DIW dispense drawer, and a high flow line configured for non-critical wafer preparation operations, the high flow line receiving as an input the initial flow of DIW from the facility water supply and producing a substantially unregulated flow of DIW as a second DIW output of the DIW dispense drawer; and a chemical drawer configured to receive the substantially steady flow of DIW and the substantially unregulated flow of DIW from the DIW dispense drawer, the chemical drawer further being configured to receive an initial flow of chemicals from a chemical source, and the chemical drawer further including a second pressure regulator for stabilizing the initial flow of chemicals from the chemical source and producing a substantially steady flow of chemicals, and a mix manifold for mixing the substantially steady flow of DIW received from the DIW dispense drawer and the substantially steady flow of chemicals, the mix manifold being configured to output a chemical solution having a controlled concentration.

2. A solution delivery system for use with a wafer preparation system as recited in claim 1, wherein wafer preparation includes one of wafer cleaning, wafer etching and cleaning, and wafer conditioning.

3. A solution delivery system for use with a wafer preparation system as recited in claim 2, wherein the DIW dispense drawer further comprises:

a flow meter that is connected between the first pressure regulator and the chemical drawer, the flow meter is configured to regulate the flow rate of the substantially steady flow of DIW to the chemical drawer.

4. A solution delivery system for use with a wafer preparation system as recited in claim 3, wherein the DIW dispense drawer further comprises:

a manifold having a main input for receiving the input being provided with the initial flow of DIW from the facility water supply, the manifold further including a plurality of outputs, at least one of the outputs is configured to supply the initial flow of DIW to the first pressure regulator.

5. A solution delivery system for use with a wafer preparation system as recited in claim 3, wherein the chemical drawer further comprises:
a flow meter being coupled between the second pressure regulator and the mix manifold, the flow meter being configured to regulate a flow rate of the substantially steady flow of chemicals being delivered to the mix manifold.

6. A solution delivery system for use with a wafer preparation system as recited in claim 1, wherein the high flow line is coupled to the mix manifold of the chemical drawer, and the mix manifold passes the initial flow of DIW from the facility water supply only when the non-critical wafer preparation operations are performed.

7. A solution delivery system for use with a wafer preparation system as recited in claim 6, wherein noncritical wafer preparation operations include non-chemical fluid application within the wafer preparation system.

8. A solution delivery system for use with a wafer preparation system as recited in claim 1, wherein the chemical solution having the controlled concentration is channeled to a wafer preparation station for application of the chemical solution to a wafer.

9. A solution delivery system for use with a wafer preparation system as recited in claim 8, wherein the wafer preparation station includes a brush box.

10. A solution delivery system for use with a wafer preparation system as recited in claim 9, wherein the brush box includes a pair of brushes being configured to receive the chemical solution through the brush (TTB).

11. A solution delivery system for use with a wafer preparation system as recited in claim 10, wherein the brush box includes a drip application bar for applying the chemical solution to at least one brush of the pair of brushes.

12. A fluid delivery system for controllably channeling fluids to at least one wafer preparation station, comprising:
a de-ionized water (DIW) dispense drawer having an input for receiving an initial flow of DIW from a facility water supply, the DIW dispense drawer including,
a first pressure regulator for stabilizing the initial flow of DIW and producing a first substantially steady flow of DIW as a first DIW output of the DIW dispense drawer; and
a second pressure regulator for stabilizing the initial flow of DIW and producing a second substantially steady flow of DIW as a second DIW output of the DIW dispense drawer.

13. A fluid delivery system for controllably channeling fluids to at least one wafer preparation station as recited in claim 12, further comprising:
a high flow line being configured for non-critical wafer preparation operations, the high flow line receives as an input the initial flow of DIW from the facility water supply and directly supplies the initial flow of DIW to a chemical drawer.

14. A fluid delivery system for controllably channeling fluids to at least one wafer preparation station as recited in claim 12, further comprising:
a first flow meter being arranged within the fluid delivery system and after the first pressure regulator; and
a second flow meter being arranged within the fluid delivery system and after the second pressure regulator.

15. A fluid delivery system for controllably channeling fluids to at least one wafer preparation station as recited in claim 12, wherein the fluid delivery system is configured to deliver the first DIW output to a first chemical drawer, and the second DIW output to the first chemical drawer.

16. A fluid delivery system for controllably channeling fluids to at least one wafer preparation station as recited in claim 15, wherein the first chemical drawer is configured to deliver the first substantially steady flow of DIW to a first brush of a brush box system, and the second substantially steady flow of DIW to a second brush of the brush box system.

17. A chemical delivery system for channeling fluids received from a water source and a chemical source to a chemical wafer preparation station, comprising:
a chemical module configured to receive a flow of DIW from the water source and to receive an initial flow of chemicals from the chemical source, the chemical module including a pressure regulator for stabilizing the initial flow of chemicals from the chemical source and producing a substantially steady flow of chemicals by reducing a pressure of the initial flow of chemicals, a valve for controlling communication of chemicals coupled to a line from the chemical source at a point before the pressure regulator, and a flow meter configured to deliver a controlled amount of chemicals coupled to the line from the chemical source at a point after the pressure regulator.

18. A chemical delivery system for channeling fluids received from a water source and a chemical source to a chemical wafer preparation station as recited in claim 17, wherein the chemical module further includes,
a mix manifold for mixing the flow of DIW received from the water source and the substantially steady flow of chemicals, the mix manifold being configured to output a chemical solution having a controlled concentration.

19. A chemical delivery system for channeling fluids received from a water source and a chemical source to a chemical wafer preparation station as recited in claim 18, wherein the water source is provided through a water dispensing module, the water dispensing module comprising:
a de-ionized water (DIW) dispenser having an input for receiving an initial flow of DIW from a facility water supply, the DIW dispenser including,
a first pressure regulator for stabilizing the initial flow of DIW and producing a first substantially steady flow of DIW as a first DIW output of the DIW dispenser; and
a second pressure regulator for stabilizing the initial flow of DIW and producing a second substantially steady flow of DIW as a second DIW output of the DIW dispenser;
wherein the first DIW output and the second DIW output are provided to the chemical module.

20. A chemical delivery system for channeling fluids received from a water source and a chemical source to a chemical wafer preparation station as recited in claim 18, wherein the chemical module couples to at least one brush box having a pair of brushes.

* * * * *